(12) United States Patent
Jeanneteau et al.

(10) Patent No.: US 10,009,037 B2
(45) Date of Patent: Jun. 26, 2018

(54) MODULAR ELECTRONIC APPARATUS INCLUDING A PLURALITY OF CIRCUIT UNITS CONNECTED BY AN INTERNAL COMMUNICATION BUS

(71) Applicant: Electrolux Home Products Corporation N. V., Brussels (BE)

(72) Inventors: Laurent Jeanneteau, Forli (IT); Andrea Fattorini, Forli (IT); Thibaut Rigolle, Forli (IT); Svend Erik Christiansen, Forli (IT)

(73) Assignee: Electrolux Home Products Corporation N.V., Brussels (BE)

( * ) Notice: Subject to any disclaimer, the term of this patent is extended or adjusted under 35 U.S.C. 154(b) by 310 days.

(21) Appl. No.: 14/432,670

(22) PCT Filed: Nov. 11, 2013

(86) PCT No.: PCT/EP2013/073479
§ 371 (c)(1),
(2) Date: Mar. 31, 2015

(87) PCT Pub. No.: WO2014/076027
PCT Pub. Date: May 22, 2014

(65) Prior Publication Data
US 2015/0249460 A1    Sep. 3, 2015

(30) Foreign Application Priority Data
Nov. 19, 2012 (EP) .................................... 12193125

(51) Int. Cl.
*H05B 1/02*    (2006.01)
*H03M 1/12*    (2006.01)
(Continued)

(52) U.S. Cl.
CPC .......... *H03M 1/12* (2013.01); *G01R 19/0084* (2013.01); *H04B 3/00* (2013.01)

(58) Field of Classification Search
CPC ....... H01M 1/12; G01R 19/0084; H04B 3/00; H05B 1/02; H05B 1/0258;
(Continued)

(56) References Cited

U.S. PATENT DOCUMENTS 5,235,159 A * 8/1993 Kornrumpf ........... F24C 15/106
219/483
5,293,447 A * 3/1994 Fanney ............... F24D 19/1057
136/248

(Continued)

FOREIGN PATENT DOCUMENTS

| CN | 101482749 A | 7/2009 |
|---|---|---|
| CN | 201628954 U | 11/2010 |
| EP | 1326172 A2 | 7/2003 |

OTHER PUBLICATIONS

International Search Report for PCT/EP2013/073479, dated Feb. 13, 2014, 2 pages.

*Primary Examiner* — Mark Paschall
(74) *Attorney, Agent, or Firm* — Pearne & Gordon LLP

(57) ABSTRACT

A modular electronic and/or electric apparatus including a plurality of circuit units connected by an internal communication bus. The circuit unit includes at least two serial resistor elements forming a voltage divider. The resistor elements of the circuit units are serially connected and form an ID wire. The ID wire is interconnected between a first voltage terminal and a second voltage terminal. The circuit unit comprises at least one analog-digital converter. A connection point between two resistor elements of one circuit unit is connected to an analog input terminal of the analog-digital converter. A digital output terminal of the analog-digital converter is connected to the internal communication
(Continued)

bus. The modular electronic and/or electric apparatus includes a master unit connected to the internal communication bus. In particular, the present invention relates to a modular domestic appliance including a plurality of circuit units connected by an internal communication bus.

16 Claims, 1 Drawing Sheet

(51) Int. Cl.
*H04B 3/00* (2006.01)
*G01R 19/00* (2006.01)

(58) Field of Classification Search
CPC ........ H05B 2203/007; H05B 2203/028; H05B 1/0252; H05B 3/0071; H05B 3/0076
USPC ................ 219/483–486, 412–414, 497, 508
See application file for complete search history.

(56) References Cited

U.S. PATENT DOCUMENTS

| | | | |
|---|---|---|---|
| 6,974,934 B2* | 12/2005 | Sprock | G01K 1/024 |
| | | | 219/483 |
| 9,492,826 B2* | 11/2016 | Hanagata | B01L 7/525 |
| 2003/0048474 A1* | 3/2003 | Hong | B65H 3/44 |
| | | | 358/1.15 |
| 2013/0220991 A1* | 8/2013 | Honeck | E01B 7/24 |
| | | | 219/483 |

* cited by examiner

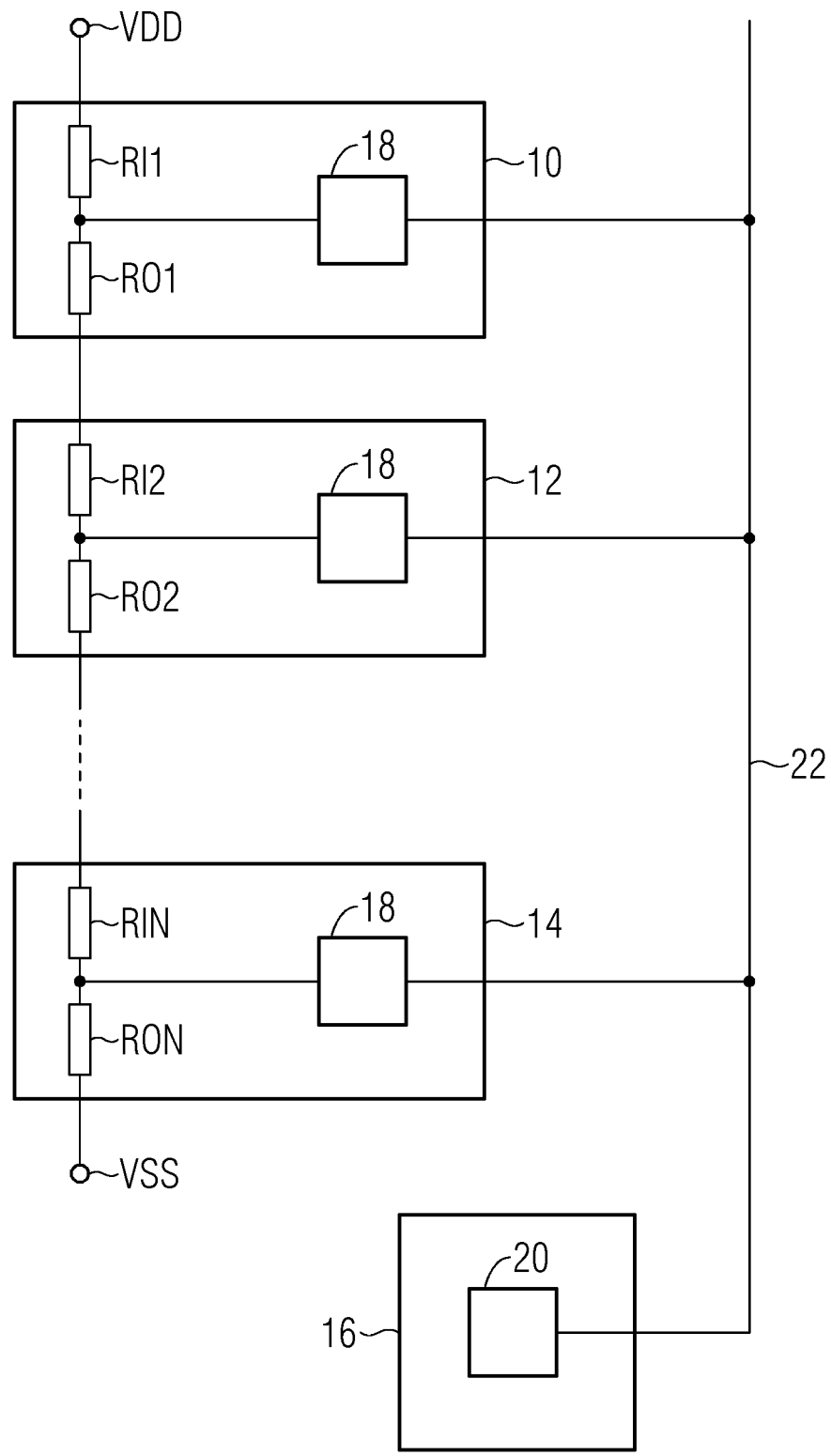

MODULAR ELECTRONIC APPARATUS INCLUDING A PLURALITY OF CIRCUIT UNITS CONNECTED BY AN INTERNAL COMMUNICATION BUS

The present invention relates to a modular electronic and/or electric apparatus including a plurality of circuit units connected by an internal communication bus according to the preamble of claim 1. In particular, the present invention relates to a modular domestic appliance including a plurality of circuit units connected by an internal communication bus.

In a modular electronic and/or electric apparatus with a plurality of circuit units and an internal bus communication system, a unique ID has to be assigned for each of said circuit units. There are different methods for assigning the IDs for the circuit units. Some methods require manual labour or extensive hardware.

US 2003/0048474 A1 discloses an apparatus and a method for recognizing trays in a printer. The trays form the circuit units. Each circuit unit comprises two serial resistor elements forming a voltage divider. Each circuit unit comprises an analogue-digital converter. A connection point between the two resistor elements of one circuit unit is connected to an analogue input terminal of the analogue-digital converter. A digital output terminal of the analogue-digital converter is connected to the internal communication bus. The apparatus comprises a master unit connected to the internal communication bus. The resistor elements of the circuit units form a resistor network with a predetermined structure. The apparatus is provided for predetermined kinds of circuit units.

It is an object of the present invention to provide a modular electronic apparatus with a plurality of circuit units and an internal communication bus, which allows an automatic and dynamic setting of IDs for arbitrary circuit units.

The object of the present invention is achieved by the modular electronic and/or electric apparatus according to claim 1.

According to the present invention the resistor elements of the circuit units are serially connected and form an ID wire, wherein the ID wire is interconnected between a first voltage terminal and a second voltage terminal.

The main idea of the present invention is the voltage divider on each circuit unit, wherein the voltage dividers of all circuit units are serially connected and form the ID wire. Each circuit unit has an own characterizing voltage value on its connection point of its voltage divider. Each circuit unit has a different characterizing voltage. The ID of the circuit unit depends on said characterizing voltage. The circuit units are arbitrarily exchangeable. The characterizing voltage depends on the position of the circuit unit and on the resistance values of its resistor elements.

According to a preferred embodiment of the present invention the circuit unit comprises two serial resistor elements and one connection point between said resistor elements. The two serial resistor elements of the circuit unit reduced the complexity of the modular electronic apparatus.

Further, the circuit unit comprises at least one control unit. The control unit is easily connectable to the internal communication bus.

In a similar way, the master unit comprises at least one master control unit. The master control unit is connectable to the circuit units and their control units via the internal communication bus by low complexity.

For example, the resistor elements of the ID wire have the same resistance values. In this case, the characterizing voltages of the circuit units are equally spaced from each other.

Further, a voltage between the connection point of the circuit unit and the first voltage terminal or second voltage terminal of the ID wire defines an analogue value of an ID of said circuit unit.

In a similar way, a value at the digital output terminal of the analogue-digital converter of the circuit unit corresponding with the analogue value of the ID of said circuit unit defines a digital value of the ID.

In particular, a matrix of values is provided, wherein a column or line of said matrix corresponds with a total number of circuit units and the line or column, respectively, of the matrix corresponds with the ID of one of the circuit units.

For example, the matrix is stored in the control unit of each circuit unit, so that each circuit unit is able to find its ID.

Alternatively, the matrix is calculable in the control unit by at least one formula, so that each circuit unit is able to find its ID.

For example, the modular electronic and/or electric apparatus is a domestic appliance.

In particular, the modular electronic and/or electric apparatus is a cooking oven and/or a cooking hob.

Further, the present invention relates to a method for determining the IDs for the circuit units of the modular electronic and/or electric apparatus mentioned above, wherein said method comprises the steps of:
- informing each circuit unit about the total number of circuit units connected to the internal communication bus by the master unit,
- detecting a voltage at the connection point between two resistor elements of each circuit unit, and
- determining the ID for each circuit unit on the basis of the total number of circuit units and the voltage at the connection point between the resistor elements of said circuit unit according to a predetermined assignment rule.

In particular, the assignment rule is stored in each circuit unit and/or is calculable in the control unit by at least one formula.

Novel and inventive features of the present invention are set forth in the appended claims.

The present invention will be described in further detail with reference to the drawings, in which FIG. 1 illustrates a schematic circuit diagram of a modular electronic apparatus according to a preferred embodiment of the present invention.

FIG. 1 illustrates a schematic circuit diagram of a modular electronic apparatus according to a preferred embodiment of the present invention. The modular electronic apparatus comprises a plurality of electronic elements. Further, the modular electronic apparatus may include also electric components.

The modular electronic apparatus includes a plurality of the circuit units 10, 12 and 14. In FIG. 1 a first circuit unit 10, a second circuit unit 12 and an n-th circuit unit 14 are represented. Preferably, the circuit units 10, 12 and 14 are exchangeable. For example, each circuit unit 10, 12 and 14 includes a printed circuit board attachable in a slot.

The modular electronic apparatus includes an internal communication bus 22. Each circuit unit 10, 12 and 14 is connected to the internal communication bus 22. The internal communication bus 22 is connected to and controlled by a master unit 16. Each circuit unit 10, 12 and 14 includes a control unit 18. In a similar way, the master unit 16 includes a master control unit 20. The control units 18 and the master control unit 20 include a digital interface in each case. The control units 18 and the master control unit 20 are connected to the internal communication bus 22 via the digital interface.

Each circuit unit 10, 12 and 14 comprises two serial resistor elements. In general, the circuit units 10, 12 and 14 may include more than two serial resistor elements. The first circuit unit 10 comprises a first input resistor element RI1 and a first output resistor element RO1. Accordingly, the second circuit unit 12 comprises a second input resistor element RI2 and a second output resistor element RO2. In a similar way, the n-th circuit unit 14 comprises an n-th input resistor element RIN and an n-th output resistor element RON. The serial resistor elements form a voltage divided on each circuit unit 10, 12 and 14.

Further, the serial resistor elements RI1, RO1, RI2, RO2, RIN and RON of each circuit unit 10, 12 and 14 are connected in series. The series of the serial resistor elements RI1, RO1, RI2, RO2, RIN and RON forms an ID wire. The first input resistor element RI1 of the first circuit unit 10 is connected to a first voltage terminal VDD. In a similar way, the n-th output resistor element of the n-th circuit unit 14 is connected to a second voltage terminal VSS. On the connection point between the input resistor element and output resistor element of each circuit unit 10, 12 and 14 a characteristic voltage is applied. The circuit units 10, 12 and 14 have different characteristic voltages.

The connection point between the input resistor element and output resistor element of each circuit unit 10, 12 and 14 is connected to the control unit 18 of the corresponding circuit unit 10, 12 and 14. Each control unit 18 includes an AD converter. The characteristic voltage is an analogue value and applied to an input of the AD converter. In the AD converter the analogue value of the characteristic voltage is converted to a digital value and applied to the internal communication bus 22. The characteristic voltage of the circuit unit 10, 12 or 14 depends on the position of said circuit unit 10, 12 or 14 within the ID wire and on the values of the resistor elements RI1, RO1, RI2, RO2, RIN and RON. By this concept it is impossible, that different circuit units 10, 12 and 14 have the same characteristic voltages.

For example, the first input resistor element RI1 of the first circuit unit 10 is connected or connectable by a jumper to the first voltage terminal VDD. In a similar way, the n-th output resistor element RON of the n-th circuit unit 14 is connected or connectable by another jumper to the second voltage terminal VSS.

The conversion of the analogue value of the characteristic voltage into the digital unit ID is described below.

A supply voltage VCC of the AD converter is divided through a number N(ID) of unit IDs. The number N(ID) of the unit IDs corresponds with the number of circuit units 10, 12 and 14. The quotient of the supply voltage VCC of the AD converter and the number N(ID) of unit IDs $$N(\text{Step})=VCC/[2*N(\text{ID})] \quad (1)$$

defines the number N(step) of the steps of the AD conversion between two adjacent digital ID values.
An AD value AD(ID) for a given digital ID value D(ID) is defined by $$AD(\text{ID})=VCC-[N(\text{Step})+2*(N(\text{ID})-1)*N(\text{Step})], \quad (2)$$

wherein the range of the AD value AD(ID) starts with AD(ID)=1. A threshold value TH(ID) between two adjacent IDs is given by $$TH(\text{ID})=AD(\text{ID}+1)+N(\text{Step}). \quad (3)$$

The circuit units 10, 12 and 14 are informed by the master unit 16 about the total number of circuit units 10, 12 and 14 connected to the internal communication bus 22. Different threshold levels are defined for each different number of circuit units 10, 12 and 14 on the internal communication bus 22. When the circuit units 10, 12 and 14 receive the total number, then each circuit unit 10, 12 and 14 selects a table with threshold levels fitting with the number of IDs. Said table is a part of a matrix stored in a memory of each circuit unit 10, 12 and 14. The matrix includes a plurality of such tables, wherein each table corresponds with the total number of circuit units 10, 12 and 14 in the modular electronic apparatus.

Alternatively, the table may be calculated by formulas (3).

The verification of the correct configuration is made by a response of the control units 10, 12 and 14. Said response includes the AD value AD(ID) and the configured ID. In order to avoid any collisions on the internal communication bus 22 the control units 10, 12 and 14 response with a delay corresponding to the AD values AD(ID). The master unit 16 is able to understand, if all expected control units 10, 12 and 14 have been configured correctly. The master unit 16 examine the responses received from the control units 10, 12 and 14. It is necessary that the responses from all expected control units 10, 12 and 14 have been received, wherein the control units 10, 12 and 14 must have configured themselves different ID. The AD values AD(ID) are still available and helpful to reveal the origins of eventual mistakes in the configuration.

Another possible implementation is a completely dynamic configuration of the IDs. The master unit 16 queries for the number of circuit units 10, 12 and 14. In an initial message the master unit 16 asks the circuit units 10, 12 and 14 to respond with their AD values AD(ID) only. During this step the IDs are not yet configured. Then, the master unit 16 can examine the received responses. After the integrity of the information has been examined, the number of circuit units 10, 12 and 14 are configured by sending a new message. The number of IDs is set. The integrity of the responses may be determined by examining the AD values AD(ID) of all received messages. The AD values AD(ID) must be exist in an even range from VCC to VSS without any gaps.

The matrix below includes a plurality of tables, wherein each table corresponds with one total number of circuit units 10, 12 and 14. In this matrix, the possible numbers of circuit units 10, 12 and 14 extend from two up to twelve. The matrix relates to the case, in which all the resistor elements RI1, RO1, RI2, RO2, . . . , RIN and RON have the same resistance values.

| | Number of circuit units: | | | | |
|---|---|---|---|---|---|
| ID: | two circuit units | three circuit units | four circuit units | . . . | twelve circuit units |
| 1 | 1/2 | 1/6 | 1/2 | | 1/12 |
| 2 | 3/4 | 3/6 | 3/4 | | 3/12 |
| 3 | | 5/6 | 1/2 | | 5/12 |
| 4 | | | 3/4 | | 7/12 |

-continued

| ID: | Number of circuit units: | | | | |
|---|---|---|---|---|---|
| | two circuit units | three circuit units | four circuit units | ... | twelve circuit units |
| ... | | | | | 9/12 |
| 12 | | | | | 11/12 |

The fractions in the matrix are the AD values AD(ID). Each column of AD values AD(ID) corresponds with one total number of the circuit units 10, 12 and 14. The AD values AD(ID) are identical or correspond with the characteristic voltages of the circuit units 10, 12 and 14. Further, the AD values correspond with the position of the circuit units 10, 12 and 14 in the series of the resistor elements RI1, RO1, RI2, RO2, RIN and RON. The knowledge of the total number of circuit units 10, 12 and 14 selects the corresponding table within the matrix. The AD value AD(ID) measured for each circuit unit 10, 12 and 14 assigns the ID to the corresponding circuit unit 10, 12 and 14, respectively.

The master control unit 20 informs the circuit units 10, 12 and 14 via the internal communication bus 22 about the total number of circuit units 10, 12 and 14. Then, each circuit unit 10, 12 and 14 detects its AD value AD(ID) by the control unit 18. Knowing the total number of the interconnected circuit units 10, 12 and 14, each circuit unit 10, 12 and 14 can obtain its ID from the corresponding table within the matrix.

The content of the matrix above is stored in a memory of each circuit unit 10, 12 and 14. For example, the memory is a part of the control unit 18 of each circuit unit 10, 12 and 14.

For example, if the modular electronic apparatus includes three circuit units 10, 12 and 14, then the circuit units 10, 12 and 14 are informed by the master control unit 20. Then, each circuit unit 10, 12 and 14 detects its AD value AD(ID) and picks up said value in the column for the three circuit units. The third circuit unit 14 detects the value "⅙" and finds its ID "1". The second circuit unit 12 detects the value "⅜" and finds its ID "2". The first circuit unit 10 detects the value "⅝" and finds its ID "2".

The system of the present invention may be realized in hardware or a combination of hardware and software.

The present invention can also be embedded in a computer program product which comprises all the features enabling the implementation of the methods described herein. Further, when loaded in computer system, said computer program product is able to carry out these methods.

The modular electronic apparatus may be a domestic appliance. For example, the modular electronic apparatus is a cooking oven and/or a cooking hob. In general, the modular electronic apparatus may by an arbitrary modular electronic and/or electric device.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

LIST OF REFERENCE NUMERALS

10 first circuit unit
12 second circuit unit
14 n-th circuit unit
16 master unit
18 control unit
20 master control unit
22 internal communication bus
RI1 first input resistor element
RO1 first output resistor element
RI2 second input resistor element
RO2 second output resistor element
RIN n-th input resistor element
RON n-th output resistor element
VDD first voltage terminal
VSS second voltage terminal
VCC supply voltage
N(ID) number of unit IDs
N(Step) number of steps for AD conversion
AD(ID) AD value
TH(ID) threshold value

The invention claimed is:

1. A modular electronic and/or electric apparatus including a plurality of circuit units connected by an internal communication bus, wherein:
   each circuit unit comprises at least two serial resistor elements forming a voltage divider,
   each circuit unit comprises at least one analogue-digital converter,
   a connection point between the two resistor elements of each circuit unit is connected to an analogue input terminal of the analogue-digital converter,
   a digital output terminal of the analogue-digital converter is connected to the internal communication bus, and
   the modular electronic and/or electric apparatus comprises a master unit connected to the internal communication bus,
wherein
the resistor elements of the circuit units are serially connected and form an ID wire, wherein the ID wire is interconnected between a first voltage terminal and a second voltage terminal.

2. The apparatus according to claim 1,
wherein
   the circuit unit comprises two serial resistor elements and one connection point between said resistor elements.

3. The apparatus according to claim 1,
wherein
   the circuit unit comprises at least one control unit.

4. The apparatus according to claim 1,
wherein
   the master unit comprises at least one master control unit.

5. The apparatus according to claim 1,
wherein
   the resistor elements of the ID wire have the same resistance values.

6. The apparatus according to claim 1,
wherein
   a voltage between the connection point of the circuit unit and the first voltage terminal or second voltage terminal of the ID wire defines an analogue value of an ID of said circuit unit.

7. The apparatus according to claim 6,
wherein
   a value at the digital output terminal of the analogue-digital converter of the circuit unit corresponding with the analogue value of the ID of said circuit unit defines a digital value of the ID.

8. The apparatus according to claim 1, wherein
  a matrix of values is provided, wherein a column or line of said matrix corresponds with a total number of circuit units and a line or column, respectively, of the matrix corresponds with the ID of one of the circuit units.

9. The apparatus according to claim 8, wherein
  the values of the matrix correspond with the analogue value of the ID.

10. The apparatus according to claim 3, wherein
  the matrix is stored in the control unit of each circuit unit, so that each circuit unit is able to find its ID.

11. The apparatus according to claim 3, wherein
  the matrix is calculable in the control unit by at least one formula, so that each circuit unit is able to find its ID.

12. The apparatus according to claim 1, wherein
  the modular electronic and/or electric apparatus is a domestic appliance.

13. The apparatus according to claim 11, wherein
  the modular electronic and/or electric apparatus is a cooking oven and/or a cooking hob.

14. A method for determining IDs for the circuit units of the modular electronic and/or electric apparatus according to claim 1, wherein said method comprises the steps of:
  informing each circuit unit about the total number of circuit units connected to the internal communication bus by the master unit,
  detecting a voltage at the connection point between two resistor elements of the circuit unit, and
  determining the ID for each circuit unit on the basis of the total number of circuit units connected to the internal communication bus and the voltage at the connection point between the resistor elements of said circuit unit according to a predetermined assignment rule.

15. The method according to claim 14, wherein
  the assignment rule is stored in each circuit unit and/or is calculable in the control unit by at least one formula.

16. A modular electronic and/or electric apparatus including:
  an internal communication bus;
  a master unit connected to the internal communication bus;
  a plurality of circuit units, wherein:
    each circuit unit comprises at least two serial resistor elements forming a voltage divider,
    each circuit unit comprises at least one analogue-digital converter,
    a connection point between the two resistor elements of each circuit unit is connected to an analogue input terminal of the analogue-digital converter,
    a digital output terminal of each analogue-digital converter is connected to the internal communication bus,
  wherein the resistor elements of the circuit units are serially connected to form an ID wire interconnected between a first voltage terminal and a second voltage terminal.

* * * * *